United States Patent [19]

Tsuno et al.

[11] Patent Number: 5,474,021
[45] Date of Patent: Dec. 12, 1995

[54] EPITAXIAL GROWTH OF DIAMOND FROM VAPOR PHASE

[75] Inventors: Takashi Tsuno; Takahiro Imai; Naoji Fujimori, all of Hyogo, Japan

[73] Assignee: Sumitomo Electric Industries, Ltd., Osaka, Japan

[21] Appl. No.: 125,482

[22] Filed: Sep. 22, 1993

[30] Foreign Application Priority Data

| Sep. 24, 1992 | [JP] | Japan | 4-254376 |
| Dec. 8, 1992 | [JP] | Japan | 4-327090 |
| Feb. 4, 1993 | [JP] | Japan | 5-17399 |
| Feb. 5, 1993 | [JP] | Japan | 5-18790 |
| Jun. 30, 1993 | [JP] | Japan | 5-162085 |

[51] Int. Cl.⁶ .................................. C30B 29/04
[52] U.S. Cl. .............. 117/97; 117/94; 117/101; 117/929; 423/446
[58] Field of Search ............ 117/97, 94, 101, 117/929; 423/446

[56] References Cited

U.S. PATENT DOCUMENTS

| 5,127,983 | 7/1992 | Imai et al. | 423/446 |
| 5,198,070 | 3/1993 | Jones | 117/929 |
| 5,275,798 | 1/1994 | Aida | 117/929 |

FOREIGN PATENT DOCUMENTS

| 0487897 | 6/1992 | European Pat. Off. . | |
| 63-252999 | 10/1988 | Japan . | |
| 3-75298 | 3/1991 | Japan . | |
| 03252396 | 11/1991 | Japan | 423/446 |

OTHER PUBLICATIONS

S. Iijima et al.; Appl. Phys. Lett. 57 (1990), 2646–2648 Early Formation Of Chemical Vapor Deposition Diamond Films.
M. W. Geis et al., Appl. Phys. Lett., vol. 58, pp. 2485–2487 Large–Area Mosaic Diamond Films Approaching Single–Crystal Quality (1991).

*Primary Examiner*—Robert Kunemund
*Attorney, Agent, or Firm*—W. G. Fasse; W. F. Fasse

[57] ABSTRACT

A plurality of single-crystalline diamond plates having principal surfaces consisting essentially of {100} planes are prepared. The diamond plates are so arranged that the respective principal surfaces are substantially flush with each other. In this arrangement, an angle formed by crystal orientations of the principal surfaces between adjacent plates is not more than 5°, a clearance between the adjacent plates is not more than 30 μm, and a difference in height of the principal surfaces is not more than 30 μm between the adjacent plates. To secure this arrangement, the plurality of diamond plates are joined to each other by depositing diamond on the plates to form a single large diamond plate. After such joining, the principal surfaces of the diamond plates are polished in order to eliminate steps or height differences. Then, diamond is epitaxially grown on a polished surface of the large diamond plate from a vapor phase. In this vapor phase, proportions X, Y and Z obtained from the following equations I, II and III respectively satisfy the following conditions:

$0.5 \leq X \leq 2.0$ $0.3 \leq Y \leq 2.0$ $Z \leq 1.0$ $X = ([C]/[H]) \times 100\%$      I $Y = ([C]-[O]/[H]) \times 100\%$      II $Z = ([O]/[H]) \times 100\%$      III where [C], [O] and [H] represent molar numbers of carbon, oxygen and hydrogen atoms respectively. In this way it is possible to obtain vapor-deposited diamond having favorable characteristics.

20 Claims, 13 Drawing Sheets

EPITAXIAL GROWTH OF DIAMOND FROM VAPOR PHASE

BACKGROUND OF THE INVENTION

1. Field of the Invention

The present invention relates to vapor-deposited diamond and a method of producing the same, and more particularly, it relates to a technique for providing a large diamond single crystal which can be used for a semiconductor material, an electronic component, an to optical component or the like.

2. Description of the Background Art

Diamond, which has a number of excellent properties such as high hardness, high thermal conductivity, high light transmittance and a wide band gap, is widely used as a material for tools optical components, a semiconductor devices and electronic components, and its it may become even more important in the future.

Single crystals of natural diamond include a so called type IIa diamond single crystal which transmits ultraviolet light of up to 230 nm and also called type Ia diamond single crystal which hardly transmits ultraviolet light. In either case, it is extremely difficult to obtain a natural single crystal at least 10 mm in diameter. Although single-crystalline diamond close to 20 mm in diameter rarely occurs naturally, such diamond is too expensive for an industrial use. Natural type IIa diamond has a large amount of crystal defects and distortion. Such natural IIa diamond is regarded as unsuitable for use as a substrate for a semiconductor device, since it has an angular half-width of at least 500 seconds in an X-ray rocking curve and a half-width of at least 2 cm$^{-1}$ in a spectrum of Raman scattered light observed at around 1332 cm$^{-1}$. On the other hand, type Ia diamond cannot be used as an optical material for ultraviolet light, since it transmits no ultraviolet light having a wavelength less than or equal to 300 nm.

While natural diamond has been applied to industrial use in the past, artificially synthesized diamond is mainly applied to such industrial uses at present. At present, single crystal diamonds are industrially synthesized under a pressure of at least tens of 1000 atmospheres for stabilizing the diamonds. A superhigh pressure vessel for generating such a pressure is so expensive that it is difficult to increase the content volume of the vessel, and diamond cannot be supplied at a low cost. In such a high-pressure method, therefore, synthesis of a large single crystal is limited. Further, diamond which is produced by the high-pressure method is easily converted to a crystal called a type Ib diamond crystal, which contains nitrogen as an impurity. The type Ib diamond is relatively large, but it transmits absolutely no light of less than or equal to 400 nm in wavelength. Thus, it has been impossible to artificially synthesize a diamond single crystal at least 10 mm in diameter, which transmits ultraviolet light of around 250 nm.

On the other hand, vapor deposition can be used as a method of synthesizing diamond, which has been established with the high-pressure method. It is possible to artificially produce diamond which has a relatively large area of several to 10 cm, while such diamond is generally in the form of a polycrystalline film. When a diamond film is to be formed by vapor deposition, a substrate has generally previously been prepared by being scratched with diamond grains. It is understood that the effect of promoting the growth of a diamond film by scratching is attained due to fine particles of diamond that are left on the substrate and serve as seed crystals for growing the diamond (see e.g. S. Iijima, Y. Aikawa and K. Baba, Appl. Phys. Lett. 57 (1990), 2646). The diamond particles left on the substrate after scratching are directed in various orientations, and hence the diamond grown from the particles, which serve as seed crystals, forms a polycrystalline film. However, it is necessary to use single-crystalline diamond for ultraprecise tools optical components semiconductor devices, which require a smooth surface.

To this end, a method of epitaxially growing single-crystalline diamond by vapor deposition has been studied. In general, epitaxial growth is classified into homoepitaxial growth of growing a target material on the same type of materials a substrate, and heteroepitaxial growth of growing a target material on different types of substrates. A single-crystalline substrate of a relatively large area can easily be obtained for heteroepitaxial growth. At present, however, heteroepitaxial growth of diamond tends to cause a defect or distortion in the crystal, and it is thus unsuitable as a method of obtaining a large-area diamond single crystal to be is applied to an optical component or a semiconductor substrate. Therefore, it is still important to study homoepitaxial growth in order to produce a large-area diamond single crystal.

In relation to such homoepitaxial growth of diamond, various devices have been made in order to obtain large single crystals. Geis et al. have reported a method of arranging diamond particles several 10 to 100 μm in size, which may be used as abrasive grains on a selectively etched Si substrate for growing diamond having a strong specific crystal orientation on this substrate (M. W. Geis, H. I. Smith, A. Argoitia, J. Angus, G. H. M. Ma, J. T. Glass, J. Butler, C. J. Robinson and R. Pryor, Appl. Phys. Lett., Vol. 58 (1991), p. 2485).

Japanese Patent Laying-Open No. 3-75298 (1991) and U. S. Pat. No. 5,127,983 corresponding thereto disclose a method of arranging a plurality of single-crystalline diamond plates several mm square for growing diamond thereon from a vapor phase. According to this method, it is possible to obtain a large diamond crystal which can be regarded as a single crystal as to light transmittance and the like, although grain boundaries having extremely small differing inclinations may be present in boundaries between the substrates. In particular, it is disclosed that a practicable large diamond single crystal can be obtained by precisely controlling crystal orientations of and spaces between the plurality of diamond plates.

In order to obtain a diamond single crystal of at least 15 mm in size according to U.S. Pat. No. 5,127,983, it is important to maintain homoepitaxial growth up to a prescribed thickness. While the method of U.S. Pat. No. 5,127, 983 is remarkably effective for epitaxially growing a large diamond single crystal, the formation of particles (hereinafter referred to as abnormally grown particles) losing the epitaxial relation between the particles and the substrates is not completely suppressed. In this known method, it is possible that abnormally grown particles are generated in boundaries between the substrates. As shown in FIG. 1, an abnormally grown particle 2 is generated in a boundary region between two substrates 1 and 1' with a probability higher than those in other regions. Therefore, it is important to reduce the probability of forming abnormally grown particles in consideration of deposition of larger single-crystalline diamond.

SUMMARY OF THE INVENTION

An object of the present invention is to provide a diamond synthesizing method having a lower probability of generation of a crystal defect by improving the method described in the above discussed U.S. Pat. No. 5,127,983.

Another object of the present invention is to provide novel diamond which is prepared by the improved method.

An aspect of the present invention is directed to a method of epitaxially growing diamond on a surface which is formed by a plurality of single-crystalline diamond plates from a vapor phase containing at least carbon and hydrogen. According to this method, idiomorphic single-crystalline diamond having a surface consisting substantially of a {100} plane is prepared. This single-crystalline diamond is cut substantially in parallel with the {100} plane, to obtain a plurality of diamond plates having principal surfaces consisting substantially of {100} planes and side surfaces consisting substantially of idiomorphic crystal planes. Then, the side surfaces consisting substantially of idiomorphic crystal planes are brought into contact with each other to arrange the plurality of diamond plates so that the respective principal surfaces are substantially flush with each other. Thus, a larger surface for crystal growth is formed by the flushly aligned principal surfaces of the plurality of diamond plates. Diamond is epitaxially grown on the larger surface from a vapor phase.

One of the important features of the present invention is that an idiomorphic crystal is employed. In general, a crystal which is enclosed with six {100} planes and eight {111} planes is available as an idiomorphic diamond crystal. According to the present invention, such an available crystal is cut substantially in parallel with the {100} planes, to prepare a plurality of diamond plates. It is possible to obtain diamond plates having regular crystal plane orientations by cutting an idiomorphic crystal. When the as-obtained diamond plates are brought into contact with each other along idiomorphic side surfaces, it is possible to extremely suppress the deviation in crystal orientation between the diamond plates.

According to the preferred aspect of the present invention, a plurality of single-crystalline diamond plates having principal surfaces consisting substantially of {100} plane or a plane which forms an angle of not more than 10° with the {100} plane are prepared. The plurality of single-crystalline diamond plates are so arranged that the respective principal surfaces are substantially flush with each other. In this step, the plurality of single-crystalline diamond plates are so fixed that an angle formed by crystal orientations in relation to the principal surfaces is not more than 5° between adjacent plates, a clearance between the adjacent plates is not more than 30 μm and a difference in height in relation to the principal surfaces is not more than 30 μm between the adjacent plates. Thus obtained is a larger surface for crystal growth, which is formed by a plurality of principal surfaces. Diamond is epitaxially grown on the larger surface from a vapor phase. In such a vapor deposition step, diamond is epitaxially grown from a vapor phase having proportions X, Y and Z, which are obtained from the following equations I, II and III, satisfying the following conditions:

$0.5 \leq X \leq 2.0$ $0.3 \leq Y \leq 2.0$ $Z \leq 1.0$ $X = ([C]/[H]) \times 100\%$  I $Y = ([C]-[O]/[H]) \times 100\%$  II $Z = ([O]/[H]) \times 100\%$  III where [C], [O] and [H] represent molar numbers of carbon, oxygen and hydrogen atoms respectively.

According to this preferred aspect, an improved feature resides in that a plurality of single-crystalline diamond plates are so arranged and fixed that the difference in height in relation to the principal surfaces is not more than 30 μm between adjacent plates. While the importance of such a limited difference in height was not recognized in the above discussed U.S. Pat. No. 5,127,983, the inventors have now found that the difference in height between the substrates is as important as the clearances therebetween, as the result of deep study.

In an initial stage of epitaxial growth, abnormal growth tends to occur preferentially in side surfaces of a diamond substrate rather than at its principal surface. It is believed that this occurs because there is a high possibility that optimum growth conditions exist on the principal surface while conditions exist on side surfaces. When diamond plates deviate in height from each other, therefore, there is a high possibility that a non-epitaxially grown particle 4 will be formed from an exposed side surface 3 as shown in FIG. 2. When diamond plates are regularized in height, on the other hand, it is possible to suppress the non-epitaxial growth which is caused by regions having different growth conditions exposed in a vapor phase. Thus, it is possible to reduce the probability of abnormal growth generated in a boundary region between diamond plates.

In order to maintain a flush arrangement, the plurality of diamond plates are fixed. To this end, a plate having a flat surface is prepared and the plurality of single-crystalline diamond plates are so arranged on this plate that the principal surfaces thereof are in contact with the surface of this plate. Then, the same material is deposited on the as-arranged plurality of diamond plates, to bond the diamond plates with each other. When the as-bonded diamond plates are separated from the flat plate, there is obtained a surface for crystal growth, which is formed by the principal surfaces that had been in contact with the plate. Thus, it is possible to obtain a flat surface for crystal growth by arranging and fixing diamond plates on and to the flat plate. At this time, the surface roughness of the flat plate for receiving the diamond plates can be rendered not more than 0.1 in Rmax, while the principal surfaces of the diamond plates are preferably not more than 0.5 in Rmax. Diamond is preferably employed as the material for bonding the plurality of diamond plates with each other. It is optimum to deposit diamond in order to eliminate any difference between the jointing material and the diamond plates as to properties such as thermal expansion coefficients. The diamond is deposited by vapor deposition over all of the plates which have been arranged as described above. Consequently, the plurality of plates are joined with each other by the deposited diamond. After the diamond plates are joined with each other, the principal surfaces thereof may be polished, so that the principal surfaces can be made further flush with each other to obtain an even flatter surface for crystal growth.

Another aspect of the present invention is directed to a novel diamond single crystal which is produced by the aforementioned method. This diamond single crystal has a maximum diameter of at least 15 mm and a transmittance of at least 20% as to ultraviolet light of 250 nm in wavelength. The diamond single crystal is characterized in that an angular half-width of an X-ray rocking curve in a (400) plane is not more than 100 seconds, or that a half-width of scattered light is not more than 2 $cm^{-1}$ at a shift value 1332 $cm^{-1}$ from excited light in a Raman scattering spectrum.

Throughout the specification, Miller indices are indicated according to convention. A specific crystal plane is expressed as (hkl). The planes are equivalent to that expressed as (hkl) depending on the symmetry of a crystal are expressed as {hkl} as a group. Further, a specific crystal orientation is expressed as [hkl], and orientations equivalent thereto are expressed as <hkl> as a group.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 15A to 15C show an exemplary process for producing large diamond using diamond plates obtained by cutting an idiomorphic crystal, wherein FIG. 15A is a perspective view showing an idiomorphic crystal, FIG. 15B is a plan view showing a diamond plate obtained by cutting the crystal, and FIG. 15C is a perspective view showing two diamond plates which are brought into contact with each other along idiomorphic planes;

DESCRIPTION OF THE PREFERRED EMBODIMENTS

Figure 1:
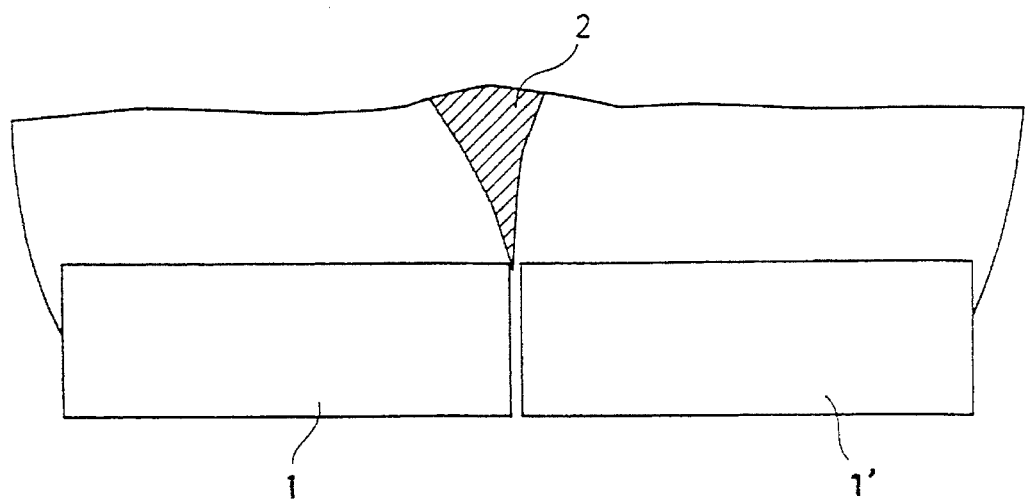
FIG. 1 is a model diagram illustrating abnormal growth that tends to occur in a boundary region between diamond plates.
Figure 2:
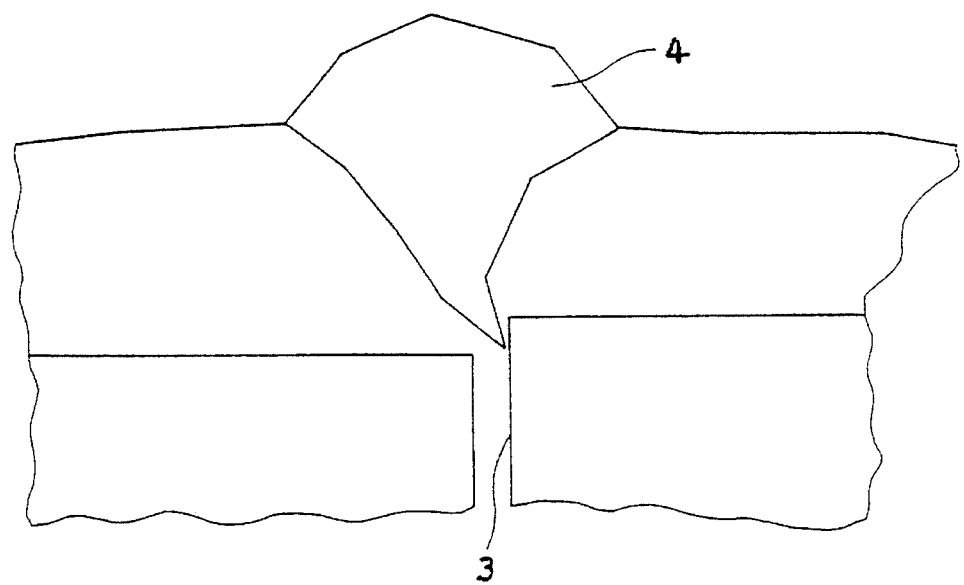
FIG. 2 typically shows diamond plates that are not flush with each other whereby non-epitaxial growth occurs.

According to the present invention, it is possible to deposit diamond from a vapor phase by thermal filament CVD, plasma CVD, a plasma jet method, a combustion flame method or laser CVD. A raw material gas is preferably prepared from a gas of hydrocarbon diluted with hydrogen, such as methane. Further, a compound containing oxygen atoms such as water, carbon monoxide, carbon dioxide or hydrogen peroxide may be added to the raw material gas. In addition, an inert gas such as argon, helium or neon may be added to the raw material gas. When the raw material gas contains no oxygen, the proportion X obtained in the above equation I is within a range of 0.5 to 2.0. If the proportion X is smaller than 0.5, growth of diamond is unpractically retarded. If the proportion X exceeds 2.0, on the other hand, it is difficult to obtain diamond having excellent crystallinity on an array of a plurality of diamond plates. When the raw material gas contains oxygen atoms, the proportion Y obtained in the above equation II is within a range of 0.3 to 2.0. Further, the proportion Z obtained in the equation III is not more than 1.0. If the proportion Y is smaller than 0.3, growth of diamond is unpractically retarded. If the proportion Y exceeds 2.0, on the other hand, it is difficult to obtain diamond having excellent crystallinity on an array of a plurality of diamond plates. Also when the proportion Z exceeds 1.0, it is difficult to obtain diamond having excellent crystallinity. When the raw material gas contains impurity components other than carbon, hydrogen, oxygen, fluorine and an inert element, particularly nitrogen (N), this easily leads to non-epitaxial growth. Therefore, the concentration of impurity components with respect to the total elemental composition of the gas is preferably not more than 500 p.p.m., excepting a dopant which may be positively employed for bringing vapor-deposited diamond into a semiconductor state.

For the purpose of vapor deposition, single-crystalline diamond plates can be maintained preferably at temperatures of about 1000° to 1400° C., more preferably about 1050° to 1250° C. By carrying out vapor deposition in such a high temperature range, it is possible to effectively suppress formation of polycrystalline diamond.

The diamond plates for epitaxial growth are preferably regular in quality. Therefore, artificial diamond single crystals which have been synthesized under high pressures are preferably employed for the diamond plates. Alternatively, the diamond plates may be prepared from natural single-crystalline diamond or diamond which is epitaxially grown by vapor deposition.

The principal surface of each diamond plate consists essentially of a {100} plane or a plane which forms an angle of not more than 10°, preferably not more than 3°, with the {100} plane. The principal surfaces are preferably polished so that surface roughness thereof is not more than 0.5 in Rmax. Edges and corners of the diamond plates are effectively chamfered with widths of not more than 20 µm, to be protected against chipping. The diamond plates are provided in shapes which are suitable for filling up a plane of a square, a rectangle, a triangle or a hexagon. A required number of such diamond plates are tightly arranged and fixed to each other.

Figure 3:
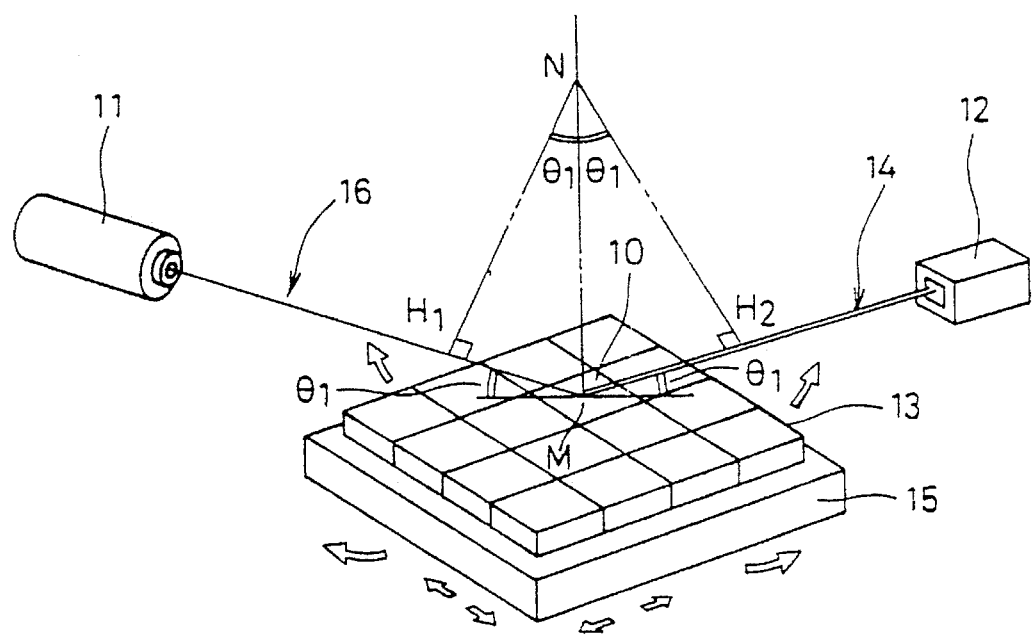
FIG. 3 is a perspective view illustrating a method of measuring dispersion of (100) planes in a normal direction through X-ray diffraction as to an array of a plurality of diamond plates.

In the arrangement of the diamond plates, it is possible to confirm whether or not an angle formed by the difference in crystal orientations of adjacent plates is within 5°, preferably within 3°, through X-ray diffraction or electron beam diffraction by a method shown in FIG. 3, for example. Referring to FIG. 3, positions of an X-ray generator 11 and an X-ray detector 12 are fixed while a sample holder 15 is so translated or swingingly rotated that a (400) diffracted beam 14 of an X-ray 16 enters the X-ray detector 12. The <100> directions of the substrates coincide with the direction of a straight line MN appearing in FIG. 3. Symbol M denotes a point of incidence of the X-ray 16 upon a (100) plane, and symbol $\theta_1$ denotes an angle which is formed by the X-ray 16, the (400) diffracted beam 14 and the (100) plane. Symbols $H_1$ and $H_2$ denote points on the X-ray 16 and the (400) diffracted beam 14, which are equally separated from the point M of incidence. Symbol N denotes an intersection between perpendicular lines drawn from the points $H_1$ and $H_2$ on a plane which is defined by the X-ray 16 and the diffracted beam 14. Since the X-ray generator 11 and the X-ray detector 12 are fixed, it is possible to detect dispersion in the <100> orientations of the substrates by measuring the swinging rotational angle of the sample holder 15. Accuracy of this measuring method is about 0.1.

Figure 4:
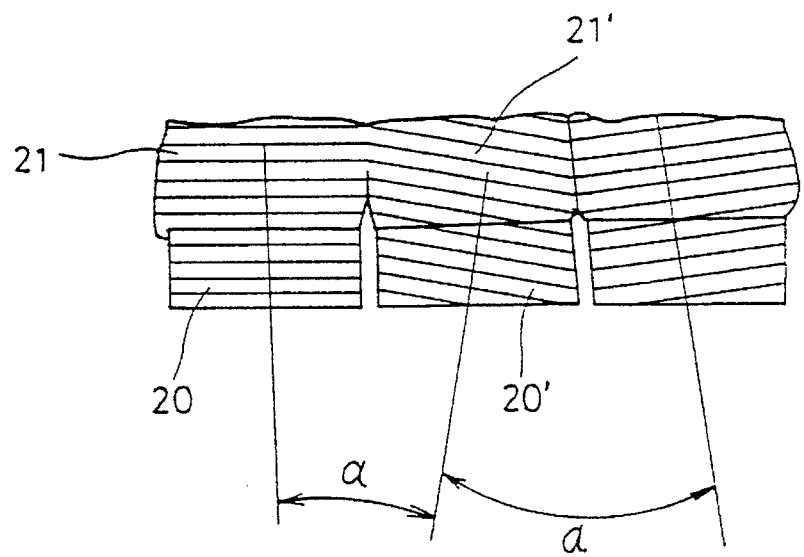
FIG. 4 is a sectional view illustrating dispersion in a normal direction with respect to (100) planes of diamond plates.
Figure 5:
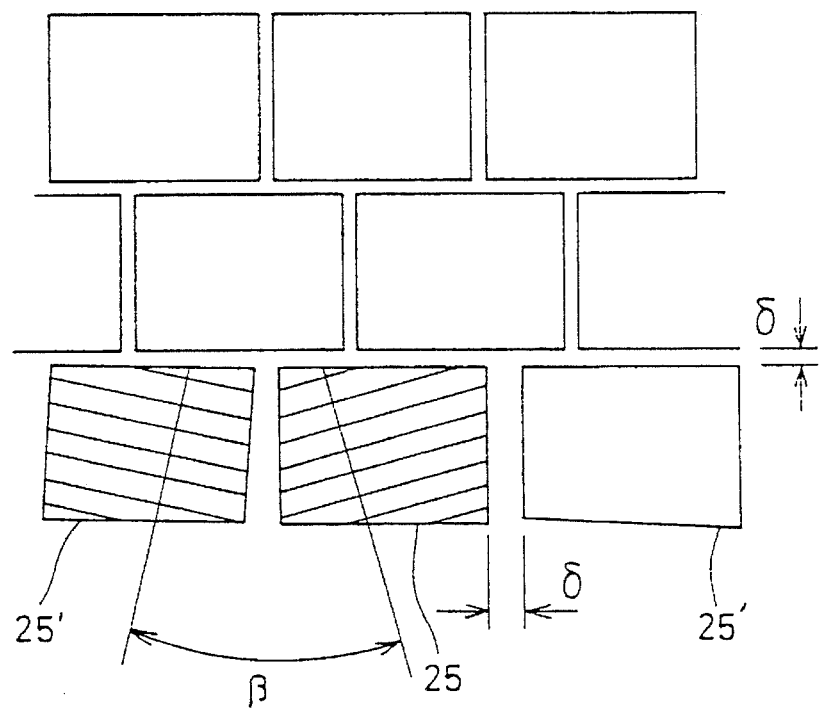
FIG. 5 is a plan view illustrating an arrangement of diamond plates.

When a plurality of substrates are arranged, an angle formed between crystal orientations of adjacent substrates is not more than 5° C., and a clearance between the adjacent substrates is not than 30 µm, and preferably not more than 15 µm. Referring to FIG. 4, a boundary is observed in an integrated portion of adjacent growth layers 21 and 21' when an angle α formed between crystal orientations of adjacent substrates 20 and 20', i.e., normal directions of crystal planes, is within 5°, while no such grain boundary is observed in upper portions of the growth layers 21 and 21' more distant from the substrates 20 and 20'. Substantially homogeneous single-crystalline diamond layers are grown in such upper portions. If the angle α is in excess of 5°, however, a grain boundary tends to remain, through all the diamond layers leading to the occurrence of a defect. Referring to FIG. 5, on the other hand, an angle β which is formed between crystal orientations parallel to principal surfaces of adjacent substrates 25 and 25' is also preferably not more than 5°. If the angle β is in excess of 5°, a crystal defect is easily caused in a boundary between the substrates 25 and 25'. A clearance δ between the substrates 25 and 25' is not more than 30 µm, and more preferably not more than 15 µm. If the clearance δ exceeds 30 µm, a crystal defect easily takes place in the boundary between the substrates 25 and 25' when large-area diamond is to be grown.

Figure 6A:
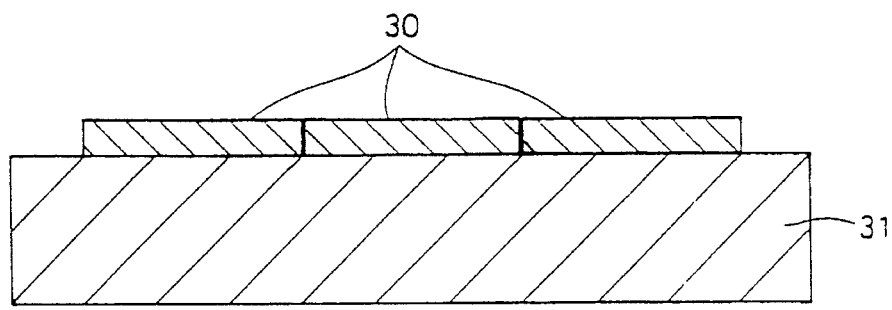
FIG. 6A is a sectional view showing diamond plates arranged on a flat plate.
Figure 6B:
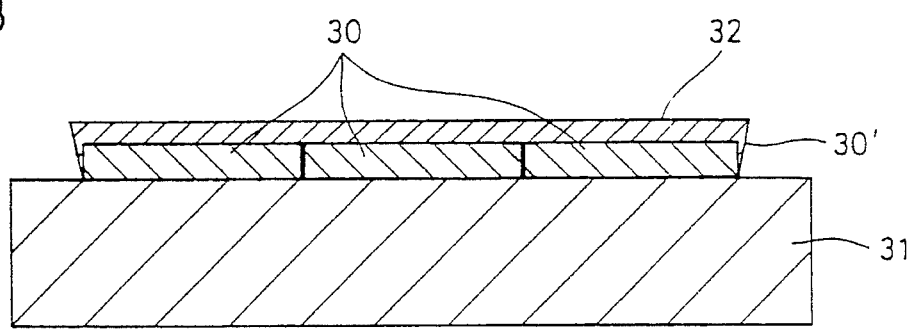
FIG. 6B is a sectional view showing a prescribed material deposited on the diamond plates for joining the plurality of diamond plates as arranged.
Figure 6C:
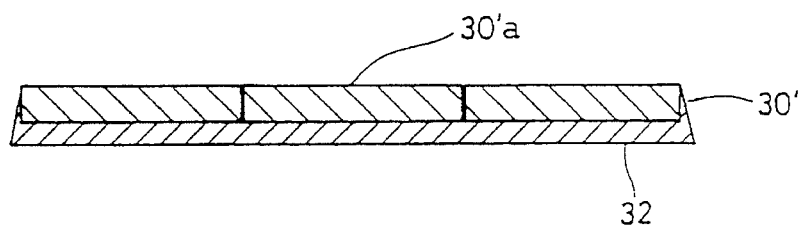
FIG. 6C is a sectional view showing the as-joined diamond plates separated from the flat plate.

According to this method, it is possible to confirm that the angle α is not more than 5°, preferably not more than 3° by the aforementioned measuring method. Referring to FIG. 6A, it is possible to arrange diamond plates 30 having pairs of parallel principal surfaces on a flat substrate 31 and to perform the aforementioned measurement on single principal surfaces. If a deviation angle exceeding 5° is recognized, the corresponding one of the plates 30 is rotated in a direction for reducing the deviation or replaced by another plate until the deviation is not more than 5°. When the deviation is suppressed to not more than 5°, more preferably not more than 3°, a binder is deposited as shown in FIG. 6B, to join the diamond plates 30 with each other. As hereinabove described, a diamond layer 32 is preferably deposited from a vapor phase as the binder material. Then, the as-joined diamond plates 30' are separated from the substrate 31, so that it is possible to obtain a surface 30'$a$ for epitaxial growth, which is formed by the other principal surfaces of the diamond plates 30 that had been in contact with the substrate 31 (FIG. 6C). Alternatively, it is possible to reduce a deviation exceeding 5° by polishing the principal surfaces that had been in contact with the flat substrate 31 after the plurality of diamond plates are joined with each other. In this case, the aforementioned measurement may be performed after the principal surfaces of the joined diamond plates have been polished. Thus, a flatter surface for epitaxial growth is prepared.

According to the present invention, the difference in height between principal surfaces of the diamond plates is not more than 30 µm, more preferably not more than 10 µm. If the difference is in excess of 30 µm, the probability of occurrence of abnormal growth is increased as described above. The diamond plates are arranged on a flat substrate and joined with each other as hereinabove described, so that the principal surfaces are flush with each other. The substrate for receiving the diamond plates has a surface roughness of not more than 0.1 in Rmax for example. The principal surfaces of the diamond plates are not more than 0.5 in Rmax as to surface roughness, for example. The principal surfaces which are arranged on a flat substrate can be flush with each other. Then, the diamond plates are fixed. For the fixation, it is possible to deposit diamond on the diamond plates from a vapor phase, as hereinabove described. The diamond plates which are joined with each other are separated from the substrate, and then subjected to synthesis of diamond having a larger size. At this time, it is most effective to polish the surfaces for crystal growth, so that the same are extremely flush with each other. Due to such polishing, a flatter surface for crystal growth is obtained. The difference in height between the principal surfaces of the diamond plates is measured by an atomic force microscope, for example.

Figure 7A:
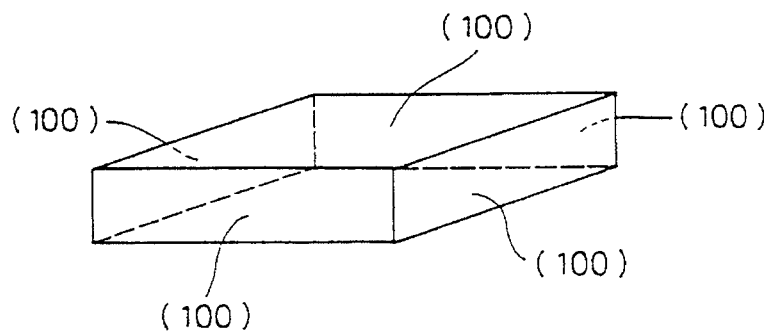
FIG. 7A is a perspective view showing a {100} type diamond plate.
Figure 7B:
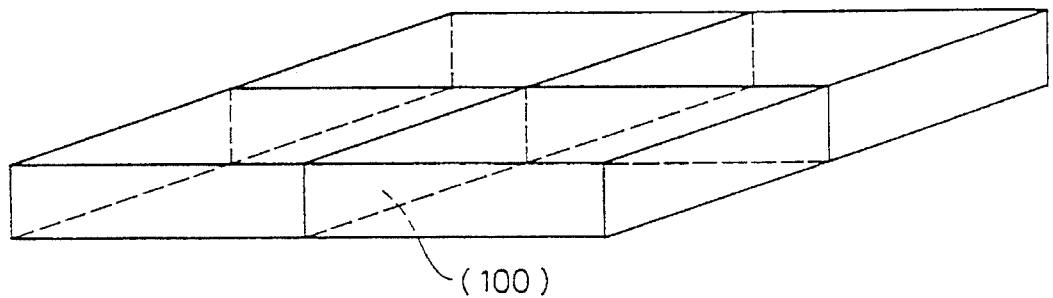
FIG. 7B is a perspective view showing {100} type diamond plates, arranged so that side surfaces thereof are in contact with each other.

In epitaxial growth on a {100} plane at a temperature of about 1000° to 1400° C., it is possible to more effectively suppress generation of twin crystals and secondary nuclei than epitaxial growth on another crystal plane. For a reason similar to this, side surfaces of the diamond plates preferably consist essentially of {100} planes, so that no crystals of abnormal orientations are generated from the side surfaces toward the principal surfaces. When the principal surface of each diamond plate is formed by a {100} plane, side surfaces enclosing the principal surface can be prepared from {100} planes which are perpendicular to the principal surface (see FIG. 7A). In this case, it is possible to arrange a plurality of diamond plates so that the side surfaces of {100} planes are in contact with each other (see FIG. 7B).

Figure 8A:
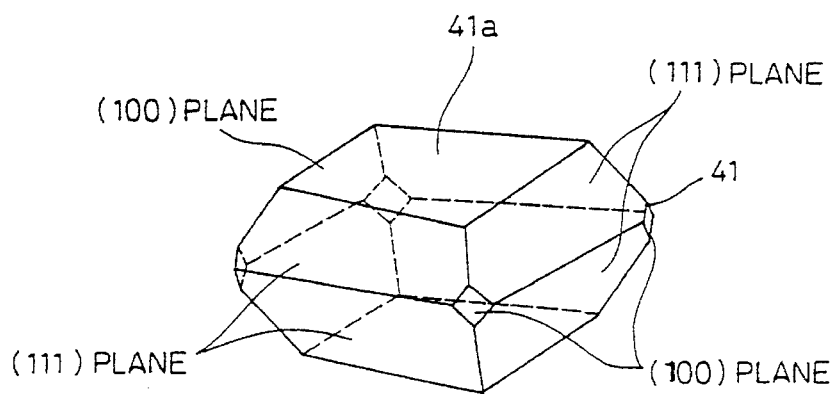
FIG. 8A is a perspective view showing an exemplary idiomorphic diamond crystal.
Figure 8B:
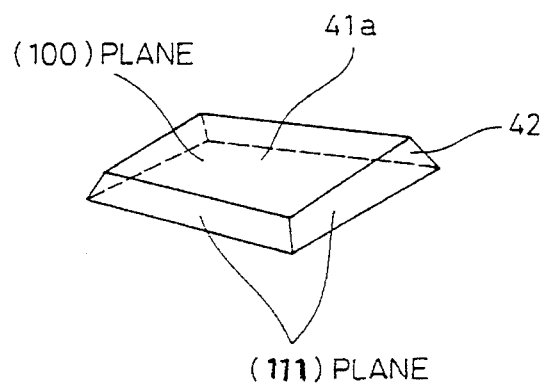
FIG. 8B is a perspective view showing a diamond plate obtained by cutting the crystal shown in FIG. 8A.
Figure 8C:
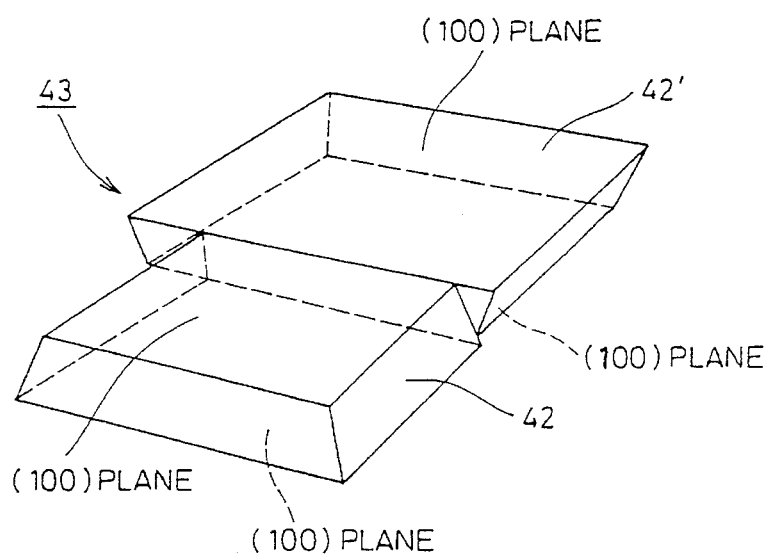
FIG. 8C is a perspective view showing an arrangement of a plurality of diamond plates obtained by cutting the crystal shown in FIG. 8A.
Figure 9A:
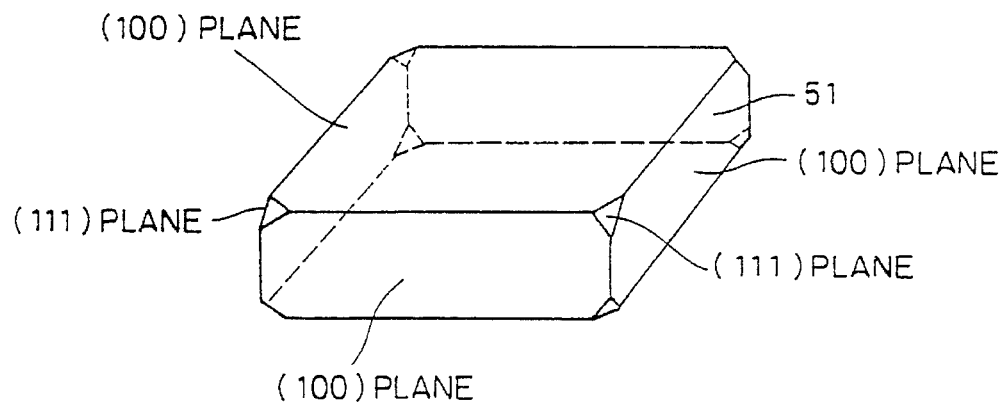
FIG. 9A is a perspective view showing another exemplary idiomorphic diamond crystal.
Figure 9B:
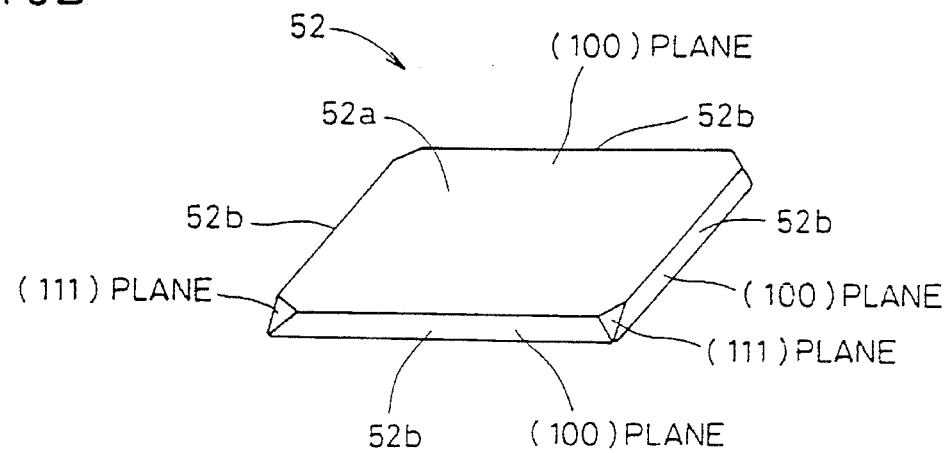
FIG. 9B is a perspective view showing a diamond plate obtained by cutting the crystal shown in FIG. 9A.
Figure 9C:
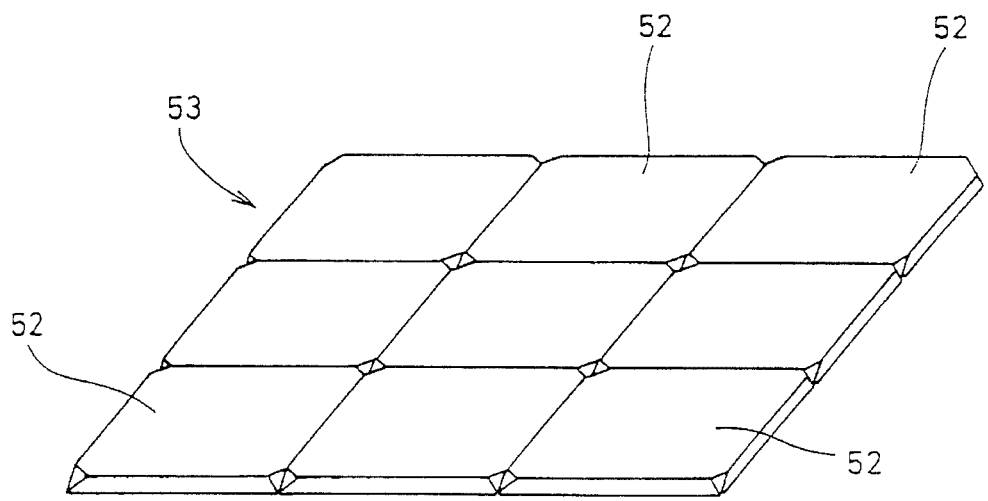
FIG. 9C is a perspective view showing an arrangement of a plurality of diamond plates obtained by cutting the crystal shown in FIG. 9A.

The plurality of diamond plates are preferably prepared from an idiomorphic single crystal. The term "idiomorphic diamond crystal" indicates a crystal of diamond which is freely grown with no hindrance by external conditions into a crystalline form completely enclosed by specific crystal planes dominated by symmetry of its crystal structure. Such an idiomorphic diamond crystal can be prepared from either natural diamond or artificial diamond synthesized under high pressure. In general, an idiomorphic diamond crystal can take a polyhedral structure (called a hexa-octahedron) consisting of six (100) planes and eight (111) planes as shown in FIG. 8A or 9A, for example. When a crystal 41 shown in FIG. 8A is employed, it is possible to prepare a diamond plate 42 in a shape shown in FIG. 8B by cutting the crystal 41 substantially in parallel with a (100) plane 41a. In this diamond plate 42, a principal surface consists essentially of a (100) plane, while four side surfaces enclosing the principal surface consist essentially of idiomorphic (111) crystal planes. When such cutting is performed repetitively, it is possible to prepare a plurality of diamond plates having principal surfaces of (100) planes and side surfaces of idiomorphic crystal planes. Then, one of two such diamond plates 42 and 42' is inverted as shown in FIG. 8C, for example, so that the diamond plates 42 and 42' are in contact with each other along single idiomorphic crystal planes thereof. The two diamond plates 42 and 42' are bonded to each other in the aforementioned manner. Thus, a wider substrate 43 is obtained so that a surface for crystal growth is formed by a (100) plane. When a crystal 51 shown in FIG. 9A is employed, on the other hand, a plurality of diamond plates are obtained by cutting the crystal 51 substantially in parallel with (100) planes similarly to the above. FIG. 9B shows one of the obtained diamond plates 52. In this diamond plate 52, a principal surface 52a consists essentially of a (100) plane, while four principal side surfaces 52b enclosing the principal surface 52a also consist essentially of idiomorphic (100) planes. Other diamond plates 52 obtained by cutting the crystal 51 also have side surfaces of (100) planes. Then, the diamond plates 52 are brought into contact with each other along the idiomorphic side surfaces and fixed to each other, thereby obtaining a wider substrate 53.

In an idiomorphic diamond crystal, deviation in crystal plane orientation is hardly observed although a small amount of microdefects are present. Therefore, it is possible to prepare diamond plates having regular crystal plane orientations by cutting an idiomorphic crystal, as hereinabove described. Further, it is possible to extremely suppress deviation in crystal orientation between such diamond plates by bringing the diamond plates into contact with each other along idiomorphic side surfaces. Such contact along the idiomorphic side surfaces is effective for suppressing deviation in crystal orientation in a surface for epitaxial growth.

According to the present invention, a substrate surface for crystal growth can be etched to a depth of at least 1 nm, more preferably at least 10 nm, in advance of the deposition of diamond. The substrate surface can be etched by a plasma which is mainly composed of hydrogen. A gas for forming such a plasma is prepared from a mixed gas containing 99% of hydrogen and 1% of oxygen, for example. The etching step can be carried out in a microwave plasma CVD apparatus for synthesizing diamond, to remove flaws and dust from the substrate surface for forming a clean surface.

According to the present invention, further, it is possible to deposit diamond while doping the same with a dopant such as boron, nitrogen or phosphorus. Such a dopant is adapted to control electrical or optical properties of the diamond. After doped semiconductor diamond is deposited on the substrate, it is possible to deposit undoped insulator diamond thereon. When electric discharge machining is carried out along the doped diamond layer in this case, it is possible to selectively extract the undoped diamond. When deposition with doping and without doping is repeated, it is possible to obtain a plurality of undoped diamond films having prescribed thicknesses by electric discharge machining.

According to the aforementioned process, it is possible to form large single-crystalline diamond of high quality on a substrate which is formed by an array of a plurality of diamond plates. It remains possible that grain boundaries having small inclinations are present in the as-obtained crystal due to a slight deviation in crystal orientation between the diamond plates. When processing for reducing the probability of abnormal growth is carried out as hereinabove described, however, it is possible to suppress the scattering of light and the occurrence of a large amount of defects caused by such grain boundaries. According to the inventive process, novel vapor-deposited diamond having the following features is obtained:

(i) The maximum diameter is at least 15 mm.

(ii) Transmittance for ultraviolet light of 250 nm wavelength is at least 20%.

(iii) An angular half-width of an X-ray rocking curve in a (400) plane is not more than 100 seconds, or a half-width of a peak at 1332 cm$^{-1}$ in a Raman scattering spectrum is not more than 2 cm$^{-1}$.

EXAMPLE 1

Study of Growth Temperature and Growth Plane

Conditions relating to a growth temperature and a growth plane were studied as follows:

Diamond single crystals for forming substrates were prepared by slicing a natural type IIa diamond crystal and polishing the same. Three groups of six substrates were respectively prepared to have principal surfaces of {111}, {100} and {110} orientations. In each of the {100} substrates, every side surface was at an angle of within 3° from the {100} plane. All substrates were 4 mm by 4 mm in size and 2.0 mm in thickness. It was confirmed by X-ray diffraction that every substrate had a deviation of not more than 2° in plane orientation from each index plane. All edges of these substrates were chamfered to expose the {100} planes in widths of 50 to 200 μm. Two substrates were employed for each type of principal surface to carry out vapor deposition at three substrate temperatures of 850° C., 1150° C. and 1450° C respectively. In every case, microwave plasma CVD was employed with a gas containing 89.5% of hydrogen (H$_2$) and 1.5% of methane (CH$_4$) and a total gas flow rate of 300 sccm. Only nitrogen was detected as an impurity contained in the raw material gas, at a rate of 5 to 20 p.p.m. with respect to the overall gas. Diamond was intermittently grown four times, with growth times of 50 hours each, i.e., 200 hours in total. The surface of each substrate was cleaned with hydrogen plasma for 3 hours in advance of the first growth. Table 1 shows the thicknesses of the as-grown films.

TABLE 1

| Plane/Temperature | 850° C. | 1150° C. | 1450° C. |
|---|---|---|---|
| {111} | 400 μm | 490 μm | 20 μm |
| {100} | 220 μm | 210 μm | 10 μm |
| {110} | 650 μm | 720 μm | 80 μm |

Then, growth end surfaces were polished and full widths at half maximums of diamond signals (1332 cm$^{-1}$) were obtained by high resolution Raman spectrometry. Table 2 shows the results. As to the {111} and {100} substrates, the results at the substrate temperature of 1450° C. were regarded substantially as being measured values relating to the substrates because the epitaxial layers of about 10 to 20 μm thickness were lost in polishing. As to the epitaxial films, therefore, the film epitaxially grown on the {100} substrate at 1150° C. exhibited the sharpest peak and regarded as having the most excellent crystallinity.

TABLE 2

| Plane/Temperature | 850° C. | 1150° C. | 1450° C. |
|---|---|---|---|
| {111} | 4.6 | 4.9 | (1.6) |
| {100} | 2.2 | 1.8 | (1.7) |
| {110} | 3.7 | 3.5 | 3.0 |

Furthermore, as to the samples grown at 850° and 1150° C. respectively, upper portions of 200 μm of the epitaxial layers were extracted. These portions were extracted by slicing as to the {100} and {110} substrates, and by etching from the substrates with laser beams converged from the substrate sides as to the {111} substrates. Substrate-side surfaces of the extracted portions were respectively polished to obtain six double-polished diamond films of 180 μm in thickness. It was impossible to carry out such processing on the samples grown at 1450° C., due to insufficient thicknesses of the epitaxially grown films. By visual observation, it seemed that transparent diamond was attained entirely over two {110} epitaxial films and the {100} epitaxial films grown at 1150° C., while black spots were partially observed on the remaining substrates. Further, numbers of cracks were observed on the {110} and {111} epitaxial films. Table 3 shows linear transmittance values for visible light of 250 nm wavelength. The epitaxial film that was grown on the {100} substrate at 1150° C. exhibited the maximum transmittance value.

TABLE 3

| Plane/Temperature | 850° C. | 1150° C. | 1450° C. |
|---|---|---|---|
| {111} | 35% | 35% | — |
| {100} | 50% | 65% | — |
| {110} | 40% | 50% | — |

Three type Ib diamond single-crystalline {100} substrates of 1 cm by 1 cm by 2 mm size were prepared by artificial high-pressure synthesis. It was confirmed by reflective electron diffraction that a deviation angle of each surface for growth was within 0.5° from the {100} plane. Side surfaces of the substrates were at angles of within 3° from the {100} planes. As to each of two samples among the three diamond substrates, diamond doped with 1000 p.p.m. of boron (B) was epitaxially grown on a single side by microwave plasma CVD to a thickness of 2 μm. As to all three substrates, on the other hand, transverse holes 0.3 mm in diameter and 1 mm in depth were formed on the side surfaces with point-converged laser beams, and alumel-chromel thermocouples were inserted in these holes to measure temperatures during film formation. Films were epitaxially grown on the three substrates by thermal filament CVD, with filaments of tantalum (Ta) with 0.2 mm diameter. Six filaments were provided at intervals of 3 mm on each sample, at a filament temperature of 1980° C. and distances of 6 mm between the filaments and the substrate upper surface. 99 % of hydrogen and 1% of methane were introduced into an apparatus under 70 Torr pressure to heat the filaments, whereby the substrate temperatures reached constant levels of 950° C. after 30 minutes. The substrate having a film doped with B was energized and heated to 1050° C. or 1150° C. The films were formed for 70 hours in these states, and thereafter the surfaces were observed. Samples having higher substrate temperatures exhibited smaller numbers having abnormal depth.

Study of Substrate Surface Height

Figure 10:
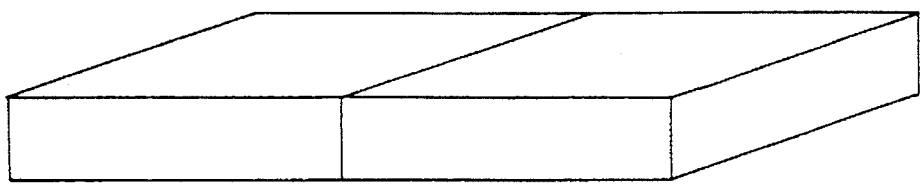
FIG. 10 is a perspective view showing two diamond plates which are arranged for vapor deposition.

Two {100} single-crystalline diamond plates 6.0 mm by 4.0 mm by 300±25 μm in size were prepared by working and polishing type Ib high-pressure synthesized diamond. The two diamond plates were arranged as shown in FIG. 10, and then diamond was grown thereon by microwave plasma CVD. A raw material gas was prepared from a mixed gas containing 98% of hydrogen and 2% of methane (proportion X=1.0). At this time, diamond was grown under of a pressure of 100 Torr and a plate temperature of 900° C. In such a system, the space between the two plates and the difference in height between the plate surfaces were varied to carry out experiments. A deviation angle between crystal planes of the two plates was not more than about 3°. Table 4 shows the results.

TABLE 4

| Experiment No. | Deviation Angle (°) | Space (μm) | Difference in Height (μm) | State of Crystal as Obtained |
|---|---|---|---|---|
| 1 | 1.0 | 10 | 20 | X |
| 2 | 2.5 | 25 | 10 | X |
| 3 | 0.5 | 40 | 10 | Y |
| 4 | 1.0 | 10 | 35 | Z |
| 5 | 1.0 | 35 | 40 | Z |

Figure 11:
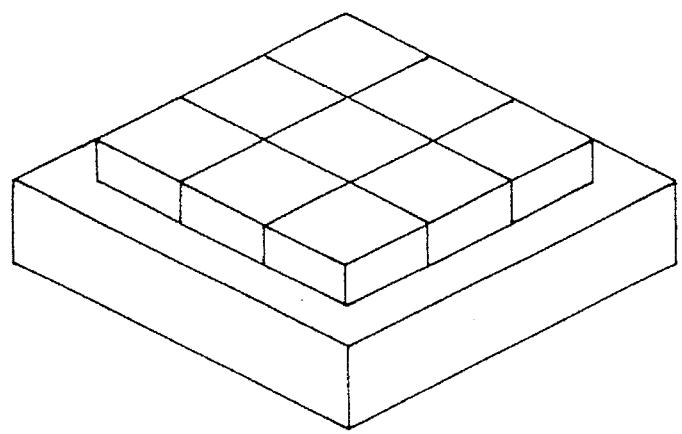
FIG. 11 is a perspective view showing nine diamond plates which are arranged for vapor deposition.
Figure 12A:
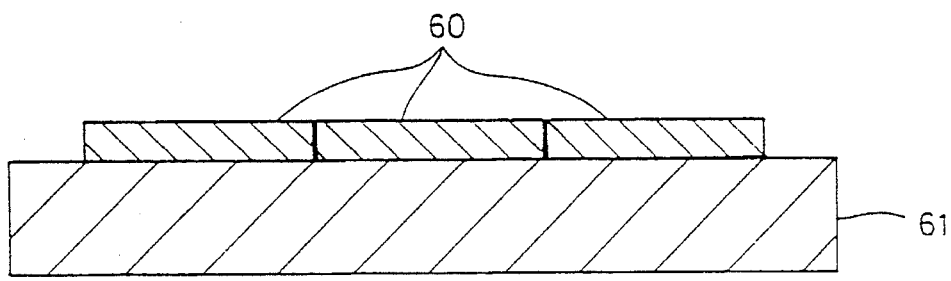
FIGS. 12A to 12D are sectional views showing steps of epitaxially growing large diamond on diamond plates which are joined with each other, respectively illustrating the diamond plates arranged on a substrate, then joined with each other, then separated from the substrate, and finally illustrating diamond which has been epitaxially grown on the joined diamond plates.
Figure 12B:
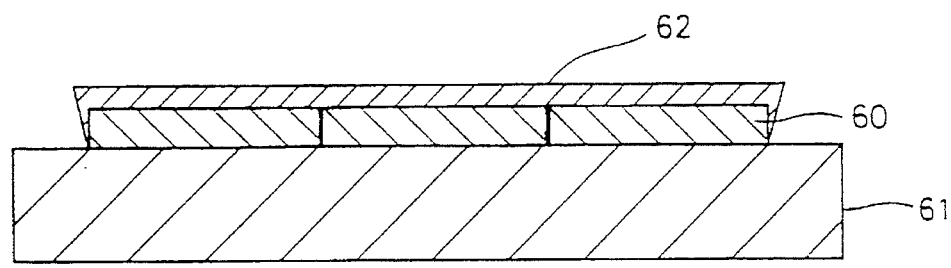
Figure 12C:
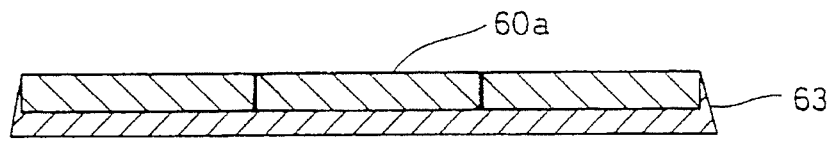
Figure 12D:
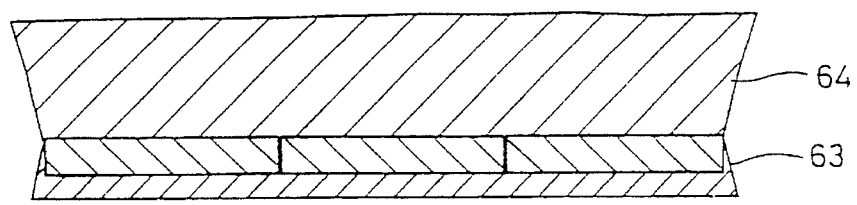

X: no polycrystal in the boundary between the plates
Y: slight polycrystal in the boundary
Z: some polycrystals in the boundary Production of Large Diamond 18 {100} single-crystalline diamond plates of 4.0 mm by 4.0 mm by 300±20 μm in size were prepared by working and polishing type Ib high-pressure synthesized diamond. Then, a pair of 3 by 3 arrays of nine diamond plates as shown in FIG. 11 were prepared. In each array, diamond plates 60 were arranged on a flat substrate 61 of Si, as shown in FIG. 12A. Then, a diamond layer 62 was deposited from a vapor phase to a thickness of about 100 μm, as shown in FIG. 12B. Thus, the nine diamond plates were bonded with each other in each array. The diamond layer 62 was deposited by microwave plasma CVD with a mixed gas containing 3% of methane and 97% of hydrogen under a pressure of 100 Torr and a plate temperature of 950° C. Then, the bonded diamond plates 60 were separated from the substrate 61 as shown in FIG. 12C, to form a large diamond plate 63 having a surface 60a that had been in contact with the substrate 61. In one of the obtained two large diamond plates 63, the surfaces 60a having been in contact with the substrate 61 were mechanically polished. Then, the back surface was mechanically polished and the large diamond plate 63 was thereafter treated with chromic acid. The other large diamond plate 63 was subjected to vapor-phase growth as such, with no polishing step. In the polished sample, steps or height differences between adjacent ones of the diamond plates 60 were not more than 0.1 μm. In the unpolished sample, on the other hand, steps of at most 40 μm were recognized. In each sample, a clearance between adjacent diamond plates 60 was not more than 20 μm, and a deviation angle of crystal orientations was not more than 3.0°. Referring to FIG. 12D, diamond 64 was epitaxially grown on the large diamond plate 63 by a plasma jet method to a thickness of 1000 μm. An introduced gas consisted of 1 slm of argon, 2 slm of hydrogen, 20 sccm of methane and 6 sccm of carbon dioxide. This diamond plate 63 was maintained at a temperature of 1050° C. A growth end surface was mirror-polished, whereafter the diamond plate 63 was removed by polishing, to separate the vapor-deposited diamond 64. Transparent diamond was obtained on those plates 60 that were polished to be flush with each other, with a transmittance of at least 68% with respect to light of 350 nm wavelength as a whole. It was possible to consider this diamond to be substantially a large single crystal of high quality. When diamond was deposited on the unpolished plate 63, on the other hand, black spots resulting from abnormal growth were recognized in boundaries between the diamond plates 60. In the obtained diamond, transmittance for light of 350 nm was not more than 5% in the lowest part. Thus, it has been clearly determined that levelling by polishing is important in order to produce large diamond of high quality.

EXAMPLE 2

Figure 13:
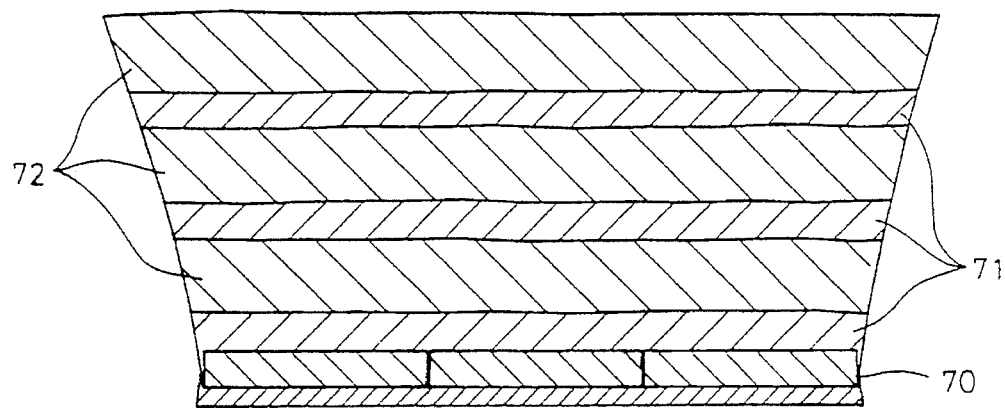
FIG. 13 is a sectional view showing alternately deposited layers of doped and undoped diamond.

Nine {100} single-crystalline diamond plates of 4.0 mm by 4.0 mm by 300±20 μm in size were prepared by working and polishing type Ib high-pressure synthesized diamond. These plates were arranged and bonded with each other similarly to Example 1, to prepare a substrate surface having no steps by polishing. Semiconductor single-crystalline diamond doped with boron was deposited on the prepared substrate surface to a thickness of 300 μm, whereafter an undoped insulator diamond single crystal was grown thereon to a thickness of 700 μm. Such a series of processes was repeated three times, to form a multilayer structure shown in FIG. 13. Referring to FIG. 13, doped diamond layers 71 and undoped diamond layers 72 have been alternately deposited on a substrate 70. In the series of processes, diamond was grown by microwave plasma CVD. A raw material gas was prepared from a mixed gas of methane and hydrogen. The concentration of methane was 2%, and the above defined proportion X was 1.0. For the purpose of doping, 250 p.p.m. of diborane with respect to methane was added to the raw material gas. The substrate temperature was maintained at 1000° C. After the growth, portions of diamond horizontally projecting from the substrate 70 were removed by laser beam machining. The multilayer structure was cut along the layers 71 doped with B by electric discharge machining. After polishing the cut surfaces, it was possible to obtain three transparent undoped diamond crystals 12 mm by 12 mm by 700 μm in size. These three diamond crystals entirely exhibited transmittance values of at least 65% with respect to light of 350 nm wavelength. The substrate 70 separated from the deposited diamond was re-usable for producing more large diamond.

EXAMPLE 3

Figure 14:
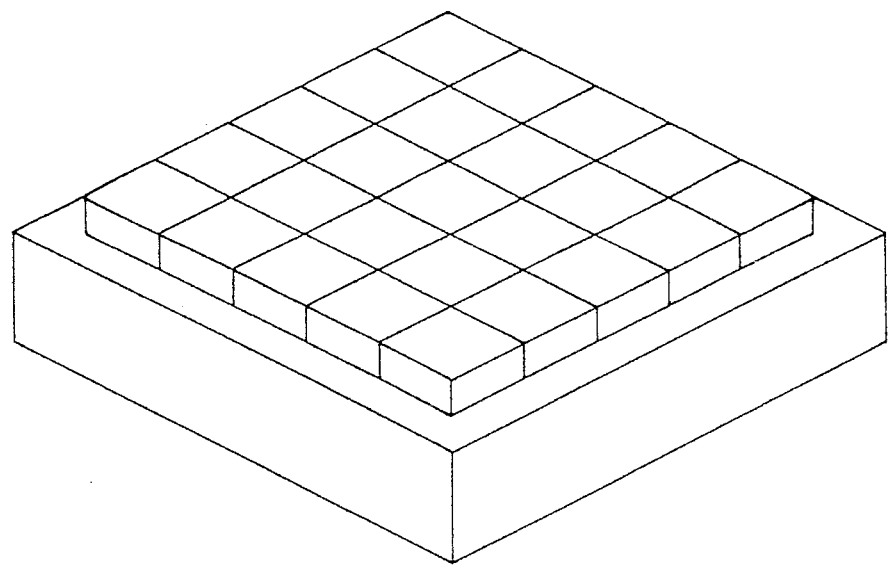
FIG. 14 is a sectional view showing an arrangement of 25 diamond plates.

As shown in FIG. 14, 25 {100} single-crystalline diamond plates 4.0 mm by 4.0 mm by 300±20 μm in size were arranged on a flat plate of Si in the form of a 5 by 5 array. Clearances between the diamond plates were suppressed to be within 15 μm. Diamond was grown on this array of diamond plates by microwave plasma CVD. A raw material gas was prepared from a hydrogen-methane mixed gas having a methane concentration of 3 (the above defined proportion X=1.5). The microwave plasma CVD was carried out under conditions of a pressure of 100 Torr and a substrate temperature of 950° C. for 100 hours. The diamond was deposited on the diamond plates to a thickness of 200 μm, whereby the 25 diamond plates were joined with each other to provide a large substrate. Both principal surfaces of the large substrate were mechanically polished, whereafter the substrate was washed with dichromic acid. Deviation angles in crystal plane orientations between the 25 diamond plates forming the large substrate examined by X-ray diffraction were 1.5° at the maximum. Further, steps or height differences between the diamond plates were 0.1 μm at the maximum. Then, a semiconductor diamond single crystal doped with boron was grown on a surface of the large substrate opposite to that provided with the joined diamond layers. A raw material gas was prepared from a hydrogen-methane mixed gas having a methane concentration of 2% (proportion X=1.0), with addition of 10 p.p.m. of diborane. The substrate temperature was maintained at 1000° C., to grow the diamond doped with boron to a thickness of 300 μm under a pressure of 120 Torr for 150 hours. Then, undoped diamond was epitaxially grown with a raw material gas containing hydrogen mixed with 2% of methane and 0.3% of $H_2O$ (proportion Y=0.85, proportion Z=0.15). The undoped diamond of high purity was grown to a thickness of 700 μm under conditions of a pressure of 120 Torr and a substrate temperature of 1100° C. The process of depositing a doped layer and a high-purity undoped layer was repeated three times. The deposited diamond was cut along the doped layers by electric discharge machining, to obtain three high-purity diamond single crystals. Both surfaces of these single crystals were mirror-polished and thereafter outer edge portions of inferior quality were removed by laser beam machining, to obtain colorless transparent diamond single crystals which were about 20 mm square and 500 to 600 μm in thickness. The obtained diamond single crystals had maximum diameters of about 27 mm. Optical transmittance values of these crystals were measured in relation to visible and ultraviolet regions, to find that ultraviolet absorption edges were at 225 nm over the entire surfaces, and transmittance values at 250 nm were 45% at the minimum. Three pairs were selected from the three obtained crystals, and subjected to measurement of double crystal X-ray rocking curves of (400) planes with X-rays of CuKα1. Half-widths of the rocking curves were 43 seconds, 40 seconds and 41 seconds respectively. A half-width of a Raman scattering spectrum shifting to and appearing at a position of 1332 $cm^{-1}$ from excited light which was emitted from an argon ion laser of 514.5 nm wavelength was 1.7 $cm^{-1}$ upon measurement with a spectroscope of 0.7 $cm^{-1}$ resolution.

Characteristics of two type IIa natural diamond single crystals, three type Ia natural diamond single crystals, four type Ib high-pressure synthetic diamond single crystals and two type IIa high-pressure synthesized diamond single crystals were examined in comparison with the aforementioned three diamond single crystals. Table 5 shows the results. In this comparison, light transmittance values were measured by mirror-polishing the light incident/outgoing surfaces. In measuring the of double crystal X-ray rocking curves, the same high-pressure synthesized type Ib diamond single crystals were employed as the primary crystals. It was proved from the results of the measurement that the inventive diamond is as large diamond of high quality, which has been impossible to attain in the past. Terms appearing in Table 5 indicate the following values:

Diameter: maximum diametral length (mm);

Thickness: optical path length (mm) of diamond in measurement of light transmittance;

Absorption Edge: transmittance threshold wavelength (nm) in visible region; to ultraviolet region Transmittance: transmittance at 250 nm (72% at the maximum due to refractive index of diamond);

X-Ray Half-Width: angular half-width (sec.) of X-ray rocking curve measured in the above method;

Raman Half-Width: half-width (sec.) of scattering peak around 1332 cm$^{-1}$ measured in the aforementioned method.

Substrate Temperature: 900° C.

Growth Time: 100 hours

The other pair was subjected to growth of diamond without an etching process. Consequently, diamond of 80 μm was grown to provide an integral diamond of two diamond crystals in each case. Deviation in orientation of the diamond forming the substrate was within 0.05° in each case. However, while the concentration or density of occurence of abnormal growth recognized on the surface of the etched sample, was 0.5/mm$^2$, that of the unetched sample was 3/mm$^2$.

TABLE 5

Comparison of Characteristics of Various Diamond Single Crystals

| Sample | Type | Diameter (mm) | Thickness (mm) | Absorption Edge (mm) | Transmittance (%) | X-Ray Half-Width (sec.) | Raman Half-Width (sec.) |
| --- | --- | --- | --- | --- | --- | --- | --- |
| Example | | | | | | | |
| 1 | Vapor Deposition | 27 | 0.6 | 225 | 47 | 36 | 1.7 |
| 2 | Vapor Deposition | 27 | 0.6 | 225 | 47 | 35 | 1.7 |
| 3 | Vapor Deposition | 27 | 0.6 | 225 | 45 | 35 | 1.7 |
| Comparative Example | | | | | | | |
| 4 | Natural IIa | 4 | 0.5 | 225 | 43 | 600 | 2.2 |
| 5 | Natural IIa | 4 | 0.5 | 225 | 45 | 750 | |
| 6 | Natural Ia | 3 | 2.0 | 305 | 0 | 64 | 2.4 |
| 7 | Natural Ia | 3 | 2.0 | 310 | 0 | 8 | |
| 8 | Natural Ia | 3 | 2.5 | 305 | 0 | 10 | |
| 9 | High-Pressure Synthesis Ib | 4 | 0.4 | 420 | 0 | 6 | 1.9 |
| 10 | High-Pressure Synthesis Ib | 4 | 0.4 | 410 | 0 | 8 | 2.0 |
| 11 | High-Pressure Synthesis Ib | 4 | 0.4 | 420 | 0 | 6 | 2.0 |
| 12 | High-Pressure Synthesis IIa | 3 | 0.3 | 225 | 55 | 6 | 1.7 |
| 13 | High-Pressure Synthesis IIa | 3 | 0.3 | 225 | 56 | 6 | 1.9 |

EXAMPLE 4

Figure 15A:
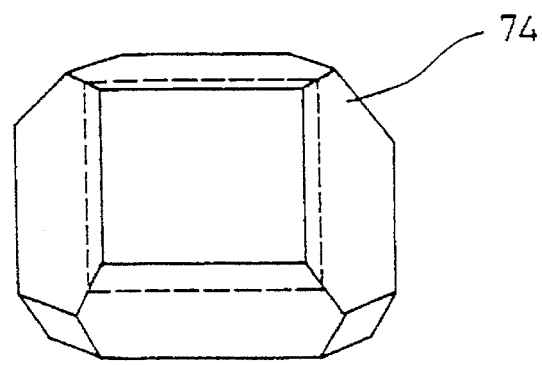
Figure 15B:
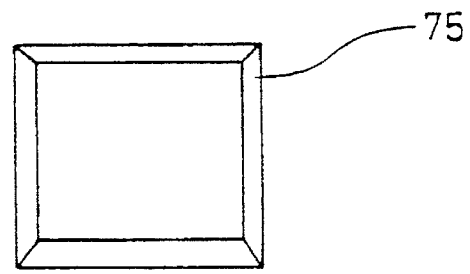
Figure 15C:
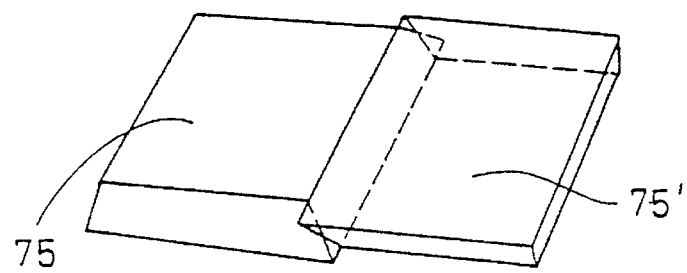

A hexa-octahedral diamond crystal 74 was prepared by high-pressure synthesis as shown in FIG. 15A, and then sliced in parallel with a square plane appearing in the crystal, to obtain a plate 75 in a shape shown in FIG. 15B. A plane orientation of a major surface of this plate 75 exhibited a deviation of within 0.05° from a {100} plane. Four such plates were obtained by similar slicing. Both surfaces of the plates were mirror-polished, and two of the four plates were inverted and brought into contact with the remaining non-inverted plates, to form two pairs of such plates 75 and 75' as shown in FIG. 15C. Diamond was grown by microwave plasma CVD.

In such growth of diamond, one of the two pairs of plates 75 and 75' was subjected to etching of a surface layer by 1 μm by plasma of a mixed gas containing 99% of hydrogen and 1% of oxygen in a microwave plasma CVD apparatus for 10 hours. Following this etching, the diamond was grown under the following conditions:

Methane: 3%

Hydrogen: 71%

Oxygen: 1%

Argon: 25%

EXAMPLE 5

Figure 16A:
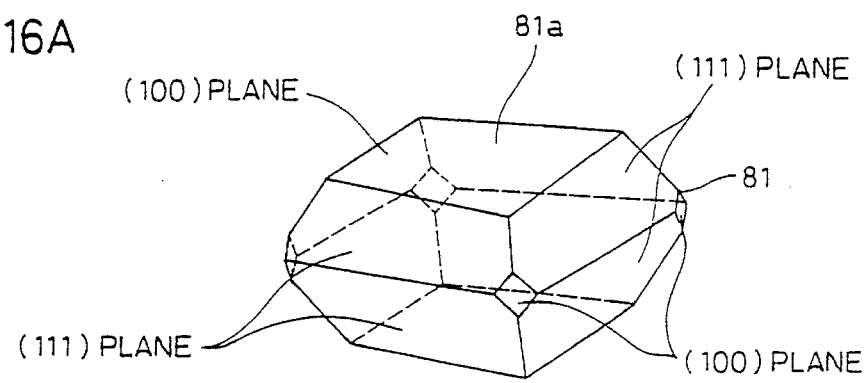
FIGS. 16A to 16D are perspective views showing another exemplary process for producing large diamond using diamond plates obtained by cutting an idiomorphic crystal, illustrating an idiomorphic crystal, respectively a diamond plate obtained by cutting the crystal, two diamond plates brought into contact with each other along idiomorphic planes, and diamond obtained by vapor deposition.
Figure 16B:
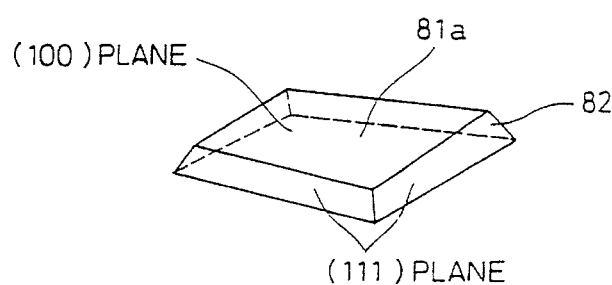

A hexa-octahedral type Ib diamond single crystal 81 was prepared as shown in FIG. 16A by high-pressure synthesis. This diamond single crystal 81 was sliced in parallel with a (100) plane 81a serving as a growth surface, to obtain a diamond crystal plate 82 of 100 μm thickness, as shown in FIG. 16B. It was confirmed by X-ray diffraction that the deviation between a plane orientation of the cut surface of the diamond crystal plate 82 and a (100) plane was within 0.05°.

Figure 16C:
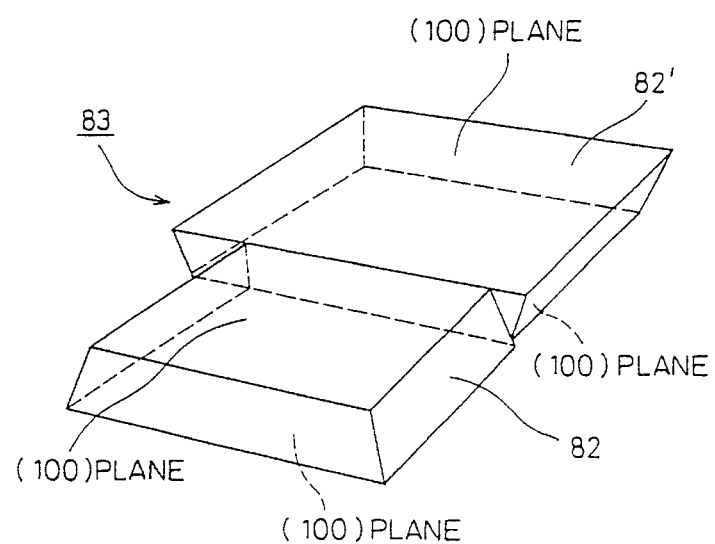

Two such diamond crystal plates 82 and 82' were prepared with mirror-polished (100) planes 81a and cut surfaces, and one of such diamond crystal plates 82 and 82' was inverted to be in contact with the other one along (111) planes as shown in FIG. 16C, thereby forming a substrate 83 for vapor deposition.

A raw material gas was supplied by well-known microwave plasma CVD so that methane, hydrogen, oxygen and argon were 3%, 71%, 1% and 25% respectively, thereby growing a diamond thin film on the substrate 83 under a gas pressure of 80 Torr and a substrate temperature of 900° C. for 500 hours.

After growth of the diamond, the substrate 83 was extracted to confirm that a diamond thin film of about 500 µm thickness had been integrally grown thereon.

Deviation between plane orientations of the two diamond crystal plates 82 and 82' was examined by a measuring method employing electron beam diffraction, to find that the deviation was suppressed to a level within 0.05°.

Figure 16D:
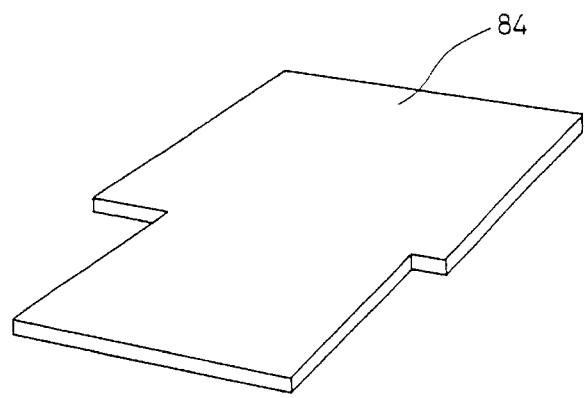

A growth surface of the integrated diamond thin film was mirror-polished and the substrate portion was removed by polishing to obtain an integral diamond single body 84 of 450 µm thickness as shown in FIG. 16D. By visual observation, no strong reflection was recognized on a junction part of the diamond thin film which was grown on the two diamond crystal plates in particular.

A sample surface of the diamond single body 84 was polished and observed with an STM (scanning tunnel electron microscope), to confirm that neither polycrystalline components nor amorphous components were present in a junction part of the grown diamond layer, although grain boundaries having small inclinations were provided.

EXAMPLE 6

Figure 17A:
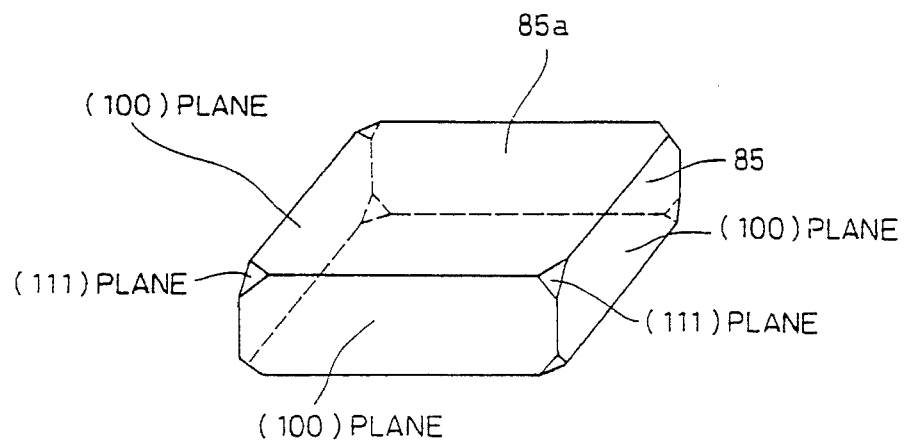
FIGS. 17A to 17C are perspective views showing still another exemplary process for producing large diamond using diamond plates obtained by cutting an idiomorphic crystal, respectively illustrating an idiomorphic crystal, a diamond plate obtained by cutting the crystal, and a substrate formed by nine diamond plates.
Figure 17B:
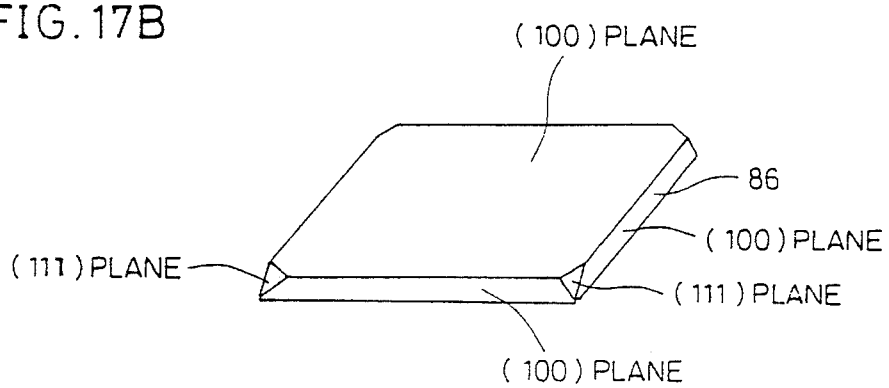

A hexa-octahedral type Ib diamond single crystal 85 was prepared by high-pressure synthesis, as shown in FIG. 17A. The diamond single crystal 85 was sliced in parallel with a (100) plane 85a, serving as a growth surface, to obtain a diamond crystal plate 86 of 150 µm thickness as shown in FIG. 17B. It was confirmed by X-ray diffraction that the deviation between a plane orientation of the cut surface of the diamond crystal plate 86 and a (100) plane was within 0.1°.

Figure 17C:
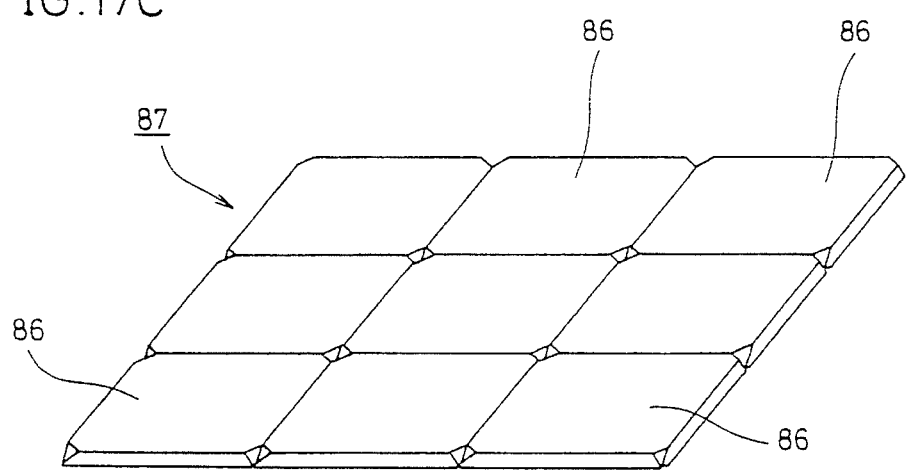

Nine diamond crystal plates 86 were prepared with mirror-polished (100) planes 85a and cut surfaces, and arranged to be in contact with each other along (100) planes as shown in FIG. 17C, to form a substrate 87 for vapor deposition.

A raw material gas was supplied by well-known microwave plasma CVD so that methane, hydrogen, oxygen and argon were 5%, 69%, 1% and 25% respectively, thereby growing a diamond thin film on the substrate 87 under a gas pressure of 75 Torr and a substrate temperature of 1050° C. for 500 hours.

After growth of the diamond, the substrate 87 was extracted to confirm that a diamond thin film of about 1000 µm in thickness had been integrally grown on this substrate 87.

Deviation between plane orientations of the nine diamond crystal plates 86 was examined by a measuring method employing electron beam diffraction, to find that the deviation was suppressed to within 0.2° at the maximum.

A growth surface of the integrated diamond thin film was mirror-polished and the substrate portion was removed by polishing to obtain an integral diamond single body of 800 µm thickness. By visual observation, no strong reflection was recognized on a junction part of the diamond thin film grown on the nine diamond crystal plates in particular.

A sample surface of the diamond single body was polished and observed with an STM, to confirm that neither polycrystalline components nor amorphous components were present in a junction part of the grown diamond layer, although grain boundaries having small inclinations were provided.

According to the present invention, a homogeneous large diamond single crystal is provided. The diamond obtained according to the present invention has characteristics suitable as a substrate for an optical or semiconductor device, in particular. According to the present invention, further, it is possible to obtain a doped diamond single crystal. The diamond single crystal according to the present invention can be widely used for a cutting edge of a precise tool, a tool having wear resistance and heat resistance, a semiconductor base material, a substrate for heat radiation, a semiconductor material, an optical material, or an acoustic diaphragm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of epitaxially growing diamond, comprising:
   a) preparing a plurality of single-crystalline diamond plates having principal surfaces forming an angle of not more than 10° with a {100} plane, back surfaces opposite said principal surfaces, and side surfaces between said principal surfaces and said back surfaces;
   b) preparing an alignment plate having a flat surface;
   c) arranging said diamond plates substantially adjacent one another on said alignment plate so that said principal surfaces are in contact with said flat surface of said alignment plate, wherein adjacent ones of said principal surfaces are no more than a 30 µm step height out of flush alignment, adjacent ones of said side surfaces are substantially in contact with each other and have no more than a 30 µm clearance therebetween, and crystal orientations relating to adjacent ones of said principal surfaces are not more than 5° out of angular alignment;
   d) depositing diamond on said back surfaces of said arranged diamond plates so that said diamond plates are bonded with each other;
   e) separating said bonded diamond plates from said alignment plate, wherein said principal surfaces that had been in contact with said alignment plate together form a larger substrate surface; and
   f) epitaxially growing diamond on said larger substrate surface from a vapor phase containing at least carbon and hydrogen, wherein proportions X, Y and Z, as follows:

$X=([C]/[H])\times 100\%$ $Y=([C]-[O]/[H])\times 100\%$ $Z=([O]/[H])\times 100\%$ where [C], [O] and [H] represent molar numbers of carbon, oxygen and hydrogen atoms respectively, satisfy the following conditions:

$0.5 \leq X \leq 2.0$ $0.3 \leq Y \leq 2.0$ $Z \leq 1.0$

2. The method of claim 1, wherein said flat surface of said alignment plate has a roughness $R_{max} \leq 0.1$.

3. The method of claim 1, wherein said clearance between adjacent ones of said side surfaces is not more than 15 µm, said step height out of flush alignment of adjacent ones of said principal surfaces is not more than 10 µm, and said crystal orientations of adjacent ones of said principal surfaces are not more than 3° out of angular alignment.

4. The method of claim 1, wherein said larger substrate surface is maintained at a temperature within a range of about 1000° C. to about 1400° C. during said step f).

5. The method of claim 1, further comprising a step of etching said principal surfaces of said diamond plates to depths of at least 1 nm before said step f).

6. The method of claim 5, wherein said etching step is carried out with a plasma mainly composed of hydrogen.

7. The method of claim 1, wherein said principal surfaces consist substantially of a plane having an inclination of not more than 3° relative to the {100} plane.

8. The method of claim 1, further comprising a step of polishing said principal surfaces after said step e) and before said step f) for making flatter said larger substrate surface.

9. The method of claim 8, wherein said larger substrate surface is maintained at a temperature within a range of about 1000° C. to about 1400° C. during said step f).

10. The method of claim 8, further comprising a step of etching said principal surfaces of said diamond plates to depths of at least 1 nm before said step f).

11. The method of claim 10, wherein said etching step is carried out with a plasma mainly composed of hydrogen.

12. The method of claim 1, wherein said step c) further comprises a step of checking the dispersion of said crystal orientations by X-ray diffraction or electron beam diffraction and rearranging said diamond plates as necessary for achieving said crystal orientations being not more than 5° out of angular alignment.

13. The method of claim 1, wherein each of said diamond plates has four of said side surfaces and each of said side surfaces consists essentially of a {100} plane or a plane that forms an angle of not more than 10° with the {100} plane.

14. The method of claim 1, wherein said step a) comprises preparing an idiomorphic single-crystalline diamond having a surface consisting substantially of a {100} plane, and cutting said single-crystalline diamond substantially in parallel with said {100} plane, thereby obtaining said plurality of diamond plates, wherein said principal surfaces consist substantially of {100} planes and said side surfaces consist substantially of idiomorphic crystal planes.

15. The method of claim 14, wherein said idiomorphic crystal planes forming said side surfaces are {100} planes.

16. The method of claim 14, wherein said idiomorphic crystal planes forming said side surfaces are {111} planes.

17. The method of claim 1, wherein said step f) further comprises adding an impurity to be deposited in said diamond being epitaxially grown.

18. The method of claim 1, wherein said step f) comprises successively depositing doped diamond and undoped diamond, and comprising a further step of separating said undoped diamond from said doped diamond .by performing electric discharge machining along said doped diamond.

19. Vapor-deposited diamond including a core layer of a plurality of diamond plates having principal surfaces and back surfaces opposite said principal surfaces, a bonding layer deposited on said back surfaces and bonding together said diamond plates, and an epitaxial layer epitaxially grown on said principal surfaces, and comprising the following characteristics:

(i) a maximum diameter of at least 15 mm;

(ii) a transmittance of at least 20% for ultraviolet light of 250 nm wavelength; and (iii) an angular half-width of not more than 100 seconds in an X-ray rocking curve in a (400) plane.

20. Vapor-deposited diamond including a core layer of a plurality of diamond plates having principal surfaces and back surfaces opposite said principal surfaces, a bonding layer deposited on said back surfaces and bonding together said diamond plates, and an epitaxial layer epitaxially grown on said principal surfaces, and comprising the following characteristics:

(i) a maximum diameter of at least 15 mm;

(ii) a transmittance of at least 20% for ultraviolet light of 250 nm wavelength; and (iii) a half-width of scattered light of not more than 2 $cm^{-1}$ at a shift value of 1332 $cm^{-1}$ from excited light in a Raman scattering spectrum.

* * * * *

UNITED STATES PATENT AND TRADEMARK OFFICE
CERTIFICATE OF CORRECTION

PATENT NO. : 5,474,021

DATED : December 12, 1995

INVENTOR(S) : Tsuno et al.

It is certified that error appears in the above-identified patent and that said Letters Patent is hereby corrected as shown below:

```
Col.  1, line 16, after "tools" insert --,--, delete "a";
         line 17, delete "its";
         line 22, replace "also" by --a so---;
         line 38, replace "use" by --uses--.
Col.  2, line  6, after "tools" insert --,--;
         line  7, after "components" insert --and--;
         line 13, after "materials" insert --as--;
         line 19, delete "is".
Col.  3, line 39, after "of" insert --the--.
Col.  4, line 17, after "while" insert --non-optimum--;
         line 49, after "plates" insert --,--.
Col. 11, line 10, after "and" insert --is--.
Col. 12, line 41, delete "of".
Col. 14, line  3, delete "conditions of";
         line 14, make a paragraph spacing between "maximum."
                  and "Then,";
         line 27, delete "conditions of";
         line 38, after "27 mm." and before "Optical transmit-"
                  insert a paragraph spacing;
         line 61, delete "of".
```

UNITED STATES PATENT AND TRADEMARK OFFICE
CERTIFICATE OF CORRECTION

PATENT NO. : 5,474,021

DATED : December 12, 1995

INVENTOR(S) : Tsuno et al.

It is certified that error appears in the above-identified patent and that said Letters Patent is hereby corrected as shown below:

Col. 14, line 65, replace "as" by --a--.

Cols. 15 and 16, Table 5, heading 1, replace "Singlc" by --Single--.

Col. 15, line 10, after "method;" insert --and--.

Signed and Sealed this

Twenty-sixth Day of March, 1996

Attest:

BRUCE LEHMAN

Attesting Officer

Commissioner of Patents and Trademarks